(12) United States Patent
Kobayashi

(10) Patent No.: US 7,213,182 B2
(45) Date of Patent: May 1, 2007

(54) TEST APPARATUS AND TEST METHOD

(75) Inventor: Shinichi Kobayashi, Tokyo (JP)

(73) Assignee: Advantest Corporation, Tokyo (JP)

( * ) Notice: Subject to any disclaimer, the term of this patent is extended or adjusted under 35 U.S.C. 154(b) by 176 days.

(21) Appl. No.: 11/039,394

(22) Filed: Jan. 19, 2005

(65) Prior Publication Data

US 2006/0161829 A1    Jul. 20, 2006

(51) Int. Cl.
*G01R 31/28* (2006.01)
*G06F 11/00* (2006.01)

(52) U.S. Cl. .......................... 714/724; 714/47

(58) Field of Classification Search ............... None
See application file for complete search history.

(56) References Cited

U.S. PATENT DOCUMENTS

| 5,673,271 | A | 9/1997 | Ohsawa et al. |
| 6,003,142 | A | 12/1999 | Mori et al. |
| 6,006,349 | A | 12/1999 | Fujisaki et al. |
| 6,862,682 | B2 * | 3/2005 | Louden et al. ............... 713/2 |
| 2002/0031026 | A1 | 3/2002 | Kobayashi |
| 2006/0041810 | A1 * | 2/2006 | Ishida et al. ............... 714/738 |

FOREIGN PATENT DOCUMENTS

| JP | 07-209389 A | 8/1995 |
| JP | 09-222465 A | 8/1997 |
| JP | 09-264937 A | 10/1997 |
| JP | 2002-022811 A | 1/2002 |
| JP | 2002-62340 A | 2/2002 |
| JP | 2006-3216 A | 1/2006 |

OTHER PUBLICATIONS

English Translation of Japanese Publication No. 2006-3216 dated Jan. 5, 2006 (28 pages).
Patent Abstracts of Japan, Publication No. 09-222465 dated Aug. 26, 1997 (2 pages).
English Translation of Japanese Publication No. 09-222465 dated Aug. 26, 1997 (19 pages).
English Translation of Japanese Publication No. 2002-62340 dated Feb. 28, 2002 (20 pages).
Patent Abstracts of Japan, Publication No. 09-264937 dated Oct. 7, 1997 (2 pages).

(Continued)

*Primary Examiner*—Christine T. Tu
(74) *Attorney, Agent, or Firm*—Osha•Liang LLP

(57) ABSTRACT

A test apparatus includes: an instruction execution unit for sequentially executing instructions in a test program for a DUT in each instruction cycle; a default pattern memory for storing default pattern sequence to be associated with default pattern identification information for identifying that default pattern sequence; a test pattern memory for storing test pattern sequence output in an instruction cycle period for executing that instruction or the default pattern identification information that is output in the instruction cycle period; a test pattern memory read unit for reading the test pattern sequence or the default pattern identification information that is stored and is associated with that instruction in the test pattern memory; a default pattern read unit for reading the default pattern sequence that is stored and is associated with the default pattern identification information in the default pattern memory; and a test pattern output unit.

8 Claims, 7 Drawing Sheets

OTHER PUBLICATIONS

English Translation of Japanese Publication No. 09-264937 dated Oct. 7, 1997 (15 pages).
Patent Abstracts of Japan, Publication No. 2002-022811 dated Jan. 23, 2002 (2 pages).
Patent Abstracts of Japan, Publication No. 07-209389 dated Aug. 11, 1995 (2 pages).
English Translation of Japanese Publication No. 07-209389 dated Aug. 11, 1995 (20 pages).
Hideaki Imada, et al. "Generation Technique of 500 MHz Ultra-High Speed Algorithmic Pattern", International Test Conference, 1996 pp. 677-684.
Junichi Hirase, "Test Time Reduction Through Minimum Execution of Tester-Hardware Setting Instructions", Test Symposium, 2001. Proceedings. 10th Asian, 2001 (pp. 173-178).
Ching-Hong Tsai, et al., "Processor-Programmable Memory BIST for Bus-Connected Embedded Memories", Design Automation Conference, 2001 (pp. 325-330).
International PCT Search Report dated Feb. 7, 2006; Application No. PCT/JP2005/019797 (7 pages).
European Search Report dated Apr. 5, 2006, Application No. 05090320.2 (7 pages).

* cited by examiner

| CODE | | | | | | | DESCRIPTION |
|---|---|---|---|---|---|---|---|
| 0 | 1 | 2 | 3 | 4 | 5 | 6 | 7 | |
| 0 | 0 | 0 | 0 | | | | | HIGH SPEED, WITH PATTERN DATA |
| 0 | 0 | 001 ~ 111 | | | | | | HIGH SPEED, SPECIFY PATTERN ID INFO |
| | | 0 | 0 | | | | | LOW SPEED, WITH PATTERN DATA |
| 1 | | 001 ~ 110 | | | | | | LOW SPEED, SPECIFY PATTERN ID INFO |
| | 1 | 1 | 1 | NUMBER OF PATTERNS | | | | LOW SPEED, WITH VARIABLE-LENGTH PATTERN DATA |

*FIG. 3*

| # | INSTRUCTION | PATTERN | | | |
|---|---|---|---|---|---|
| | | CH1 | CH2 | CH3 | CH4 |
| 1 | NOP | {011...110} | {000...110} | {011...000} | {001...110} |
| 2 | NOP | {000...110} | {011...000} | {001...110} | {011...110} |
| 3 | IDXI 100 | CODE H1 | CODE H1 | CODE H2 | CODE H3 |
| 4 | NOP | {000...110} | {011...000} | {001...110} | {011...110} |
| 5 | NOP | {011...000} | {001...110} | {011...110} | {000...110} |
| 6 | IDXI 100 | CODE H2 | CODE H3 | CODE H1 | CODE H1 |
| 7 | NOP | {001...110} | {011...110} | {000...110} | {011...000} |
| 8 | NOP | {011...110} | {000...110} | {011...000} | {001...110} |
| 9 | NOP | CODE H1 | {011...000} | {011...110} | {011...110} |
| 10 | NOP | CODE H1 | CODE H1 | {000...110} | {000...110} |
| 11 | NOP | CODE H1 | CODE H1 | CODE H1 | {011...000} |
| 12 | NOP | CODE H1 | CODE H1 | CODE H1 | CODE H1 |
| 13 | NOP | {011...110} | CODE H1 | CODE H1 | CODE H1 |
| 14 | NOP | {000...110} | {001...110} | CODE H1 | CODE H1 |
| 15 | NOP | {011...000} | {011...000} | {011...000} | CODE H1 |
| 16 | NOP | {001...110} | {001...110} | {001...110} | {001...110} |

CODE H1={101...010}
CODE H2={111...111}
CODE H3={000...000}

FIG. 4

1:NOP     P1=CODE H1

2:NOP     P1=CODE H2

3:NOP     P1=CODE L1

4:NOP     P1=CODE L7  VL=9  {SA17...25}

5:NOP     P1=CODE H5

6:NOP     P1=CODE H0  {VX1...VX32}

7:NOP     P1=CODE H4

| # | INSTRUCTION | PATTERN | | | |
|---|---|---|---|---|---|
| | | CH1 | CH2 | CH3 | CH4 |
| 1 | NOP | 0 | 1 | 1 | 0 |
| 2 | NOP | 1 | 0 | 1 | 0 |
| 3 | IDXI 100 | 1 | 1 | 1 | 0 |
| 4 | NOP | 0 | 0 | 1 | 1 |
| 5 | NOP | 0 | 1 | 0 | 1 |

*FIG. 7*

TEST APPARATUS AND TEST METHOD

BACKGROUND OF THE INVENTION

1. Field of the Invention

The present invention relates to a test apparatus and a test method. More particularly, the present invention relates to a test apparatus and a test method for compressing and storing a test program used in a test of a device under test.

2. Description of the Related Art

A test apparatus performs a test of a DUT (Device Under Test) that is an object of the test, based on a test program. The test program includes, in each instruction cycle, an instruction to be executed by the test apparatus, and a test pattern to be output to each terminal of the DUT or an expected value pattern to be compared with an output pattern output from each terminal of the DUT.

In order to reduce the data amount of the test program, a test apparatus that compresses the test program using a repeat instruction has been conventionally used. FIG. 7 shows a conventional compression format of the test program. In the test program shown in FIG. 7, NOP (no operation) instruction is executed in the first instruction cycle, so that a test pattern {0, 1, 1, 0} is output to terminals 1, 2, 3 and 4, respectively. Similarly, NOP instruction is executed in the second instruction cycle, so that a test pattern {1, 0, 1, 0} is output to the terminals 1, 2, 3 and 4, respectively. In the third instruction cycle, IDXI instruction, that is a repeat instruction, is executed, so that a test pattern {1, 1, 1, 0} is continuously output to the terminals 1, 2, 3 and 4, respectively, during 100 cycles. In this manner, in the conventional test apparatus, in a case where the same pattern is used during a plurality of instruction cycles, a repeat instruction is used so as to reduce the size of the test program.

On the other hand, with increase of operating speeds of electronic devices, a transmission rate of a signal input to and output from an electronic device dramatically increases. In order to test such an electronic device, a test apparatus is required to generate a test pattern or an expected pattern at a higher speed.

However, it is difficult to dramatically improve the performance of the test apparatus by reducing the instruction cycles in which the test program is executed. Thus, it is a realistic approach to achieve a test apparatus that generates a pattern at a high speed while executing an instruction at a relatively low speed, by supplying a plurality of test pattern or an expected pattern during one instruction cycle. In a case where compression using the repeat instruction is employed in such a testing device, compression can be performed only when the same pattern sequence that is completely the same for all terminals is continuously used during a plurality of instruction cycles. However, when even a part of the pattern sequence is different, compression cannot be applied. Thus, only by employing the compression method using the repeat instruction, compression efficiency may lower to cause shortage of a memory region for storing the test program.

SUMMARY OF THE INVENTION

Therefore, it is an object of the present invention to provide a test apparatus and a test method, which are capable of overcoming the above drawbacks accompanying the conventional art. The above and other objects can be achieved by combinations described in the independent claims. The dependent claims define further advantageous and exemplary combinations of the present invention.

According to the first aspect of the present invention, a test apparatus for testing a device under test, comprises: an instruction execution unit operable to sequentially execute instructions included in a test program for the device under test in each instruction cycle; a default pattern memory operable to store default pattern sequence to be associated with default pattern identification information for identifying the default pattern sequence, the default pattern sequence being a preset one of a plurality of test pattern sequence sets, each of which is formed by a plurality of test patterns to be sequentially output to a terminal of the device under test during an instruction cycle period; a test pattern memory operable to store, for each of the instructions, test pattern sequence that is output in an instruction cycle period in which the instruction is executed or the default pattern identification information for identifying the default pattern sequence that is output in the instruction cycle period; a test pattern memory read unit operable to, in a case where one instruction is executed, read the test pattern sequence or the default pattern identification information that is stored to be associated with the one instruction in the test pattern memory; a default pattern read unit operable to, in a case where the test pattern memory read unit read the default pattern identification information, read the default pattern sequence that is stored to be associated with the default pattern identification information in the default pattern memory; and a test pattern output unit operable to output the test pattern sequence read out by the test pattern memory to correspond to the one instruction, or the default pattern sequence read out by the default pattern read unit to a terminal of the device under test during an instruction cycle period for executing the one instruction.

The device under test may include a plurality of terminals, and the test apparatus may include the test pattern memory, the test pattern memory read unit, the default pattern read unit and the test pattern output unit to correspond to each of the plurality of terminals.

In a case where a first test pattern memory corresponding to a first terminal of the device under test stores the one set of test pattern sequence to be associated with the one instruction and a second test pattern memory corresponding to a second terminal of the device under test stores the default pattern identification information to be associated with the one instruction, the first test pattern memory read unit corresponding to the first terminal may read out the one set of test pattern sequence that is stored to be associated with the one instruction in the first test pattern memory; the second test pattern memory read unit corresponding to the second terminal may read out the default pattern identification information that is stored to be associated with the one instruction in the second test pattern memory; the second default pattern read unit corresponding to the second terminal may read out the one set of default pattern sequence that is stored to be associated with the default pattern identification information in the default pattern memory; the first test pattern output unit corresponding to the first terminal may output the one set of test pattern sequence to the first terminal during the instruction cycle period for executing the one instruction; and the second test pattern output unit corresponding to the second terminal may output the one set of default pattern sequence to the second terminal during the instruction cycle period for executing the one instruction.

The test pattern memory may store test pattern format information for identifying which one of the test pattern sequence and the default pattern identification information is stored and test pattern data including either of the test pattern sequence and the default pattern identification information, to be associated with each instruction; the test pattern memory read unit may read out the test pattern format information and the test pattern data that are stored to be associated with the one instruction in the test pattern memory; and in a case where the test pattern format information indicated that the default pattern identification information was stored, the default pattern read unit may read out the default pattern sequence that is stored in the default pattern memory to be associated with the default pattern identification information included in the test pattern data.

The test pattern memory may store test pattern format information for each of the instructions, the test pattern format information indicating that the test pattern sequence is stored when having a predetermined specific value and being used as the default pattern identification information when having a value other than the specific value, the test pattern memory further storing the test pattern sequence when the test pattern format information has the specific value; in a case where the one instruction is executed, the test pattern memory read unit may read out the test pattern format information and also reads out the test pattern sequence when the test pattern format information has the specific value, and, when the test pattern format information has the value other than the specific value, the default pattern read unit may read out the default pattern sequence that is stored to be associated with the test pattern format information in the default pattern memory.

According to the second aspect of the present invention, a test apparatus for testing a device under test, comprises: an instruction execution unit operable to sequentially execute instructions included in a test program for the device under test in each instruction cycle; a default pattern memory operable to store default pattern sequence to be associated with default pattern identification information for identifying the default pattern sequence, the default pattern sequence being a preset one of a plurality of expected value pattern sequence sets, each of which is formed by a plurality of expected value patterns that are to be sequentially compared with a plurality of output patterns sequentially output from a terminal of the device under test during an instruction cycle period; an expected value pattern memory operable to store, for each of the instructions, expected value pattern sequence that is to be compared with the plurality of output patterns in an instruction cycle period for executing the instruction, or the default pattern identification information for identifying the default pattern sequence that is to be compared with the plurality of output patterns in the instruction cycle period; an expected value pattern memory read unit operable to, in a case where one instruction is executed, read the expected value pattern sequence or the default pattern identification information that is stored to be associated with the one instruction in the expected value pattern memory; a default pattern read unit operable to, in a case where the expected value pattern memory read unit read the default pattern identification information, read the default pattern sequence that is stored to be associated with the default pattern identification information in the default pattern memory; and an expected value compare unit operable to compare the expected value pattern sequence read out by the expected value pattern memory to correspond to the one instruction, or the default pattern sequence read out by the default pattern read unit with output pattern sequence formed by a plurality of output patterns output from a terminal of the device under test during an instruction cycle period for executing the one instruction.

According to the third aspect of the present invention, a test method for testing a device under test with a test apparatus, comprises: an instruction execution step operable to sequentially execute instructions included in a test program for the device under test in each instruction cycle; a default pattern memory step operable to store default pattern sequence to be associated with default pattern identification information for identifying the default pattern sequence, the default pattern sequence being a preset one of a plurality of test pattern sequence sets, each of which is formed by a plurality of test patterns to be sequentially output to a terminal of the device under test during an instruction cycle period; a test pattern memory step operable to store, for each of the instructions, test pattern sequence that is output in an instruction cycle period for executing the instruction, or the default pattern identification information for identifying the default pattern sequence that is output in the instruction cycle period; a test pattern memory read step operable to, in a case where one instruction is executed, read the test pattern sequence or the default pattern identification information that is stored to be associated with the one instruction in the test pattern memory; a default pattern read step operable to, in a case where the default pattern identification information was read in the test pattern memory read step, read the default pattern sequence that is stored to be associated with the default pattern identification information in the default pattern memory step; and a test pattern output step operable to output the test pattern sequence read out in the test pattern memory read step to correspond to the one instruction, or the default pattern sequence read out in the default pattern read step to a terminal of the device under test during an instruction cycle period for executing the one instruction.

According to the fourth aspect of the present invention, a test method for testing a device under test with a test apparatus, comprises: an instruction execution step operable to sequentially execute instructions included in a test program for the device under test in each instruction cycle; a default pattern memory step operable to store default pattern sequence to be associated with default pattern identification information for identifying the default pattern sequence, the default pattern sequence being a preset one of a plurality of expected value pattern sequence sets, each of which is formed by a plurality of expected value patterns to be sequentially compared with a plurality of output patterns to be sequentially output from a terminal of the device under test during an instruction cycle period; an expected value pattern memory step operable to store, for each of the instructions, expected value pattern sequence that is to be compared with the plurality of output patterns in an instruction cycle period for executing the instruction, or the default pattern identification information for identifying the default pattern sequence that is compared with the plurality of output patterns in the instruction cycle period; an expected value pattern memory read step operable to, in a case where one instruction is executed, read out the expected value pattern sequence or the default pattern identification information that is stored to be associated with the one instruction in the test pattern memory step; a default pattern read step operable to, in a case where the default pattern identification information was read in the expected value pattern memory read step, read the default pattern sequence that is stored to be associated with the default pattern identification information in the default pattern memory step; and an expected value compare step operable to compare the expected value pattern sequence that was read in the expected value pattern memory read step to correspond to the one instruction or the default pattern steam that was read in the default pattern memory read step with output pattern sequence formed by a plurality of the output patterns output from the terminal of the device under test.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 3 shows an example of pattern format information according to the embodiment of the present invention.

FIG. 4 shows an exemplary test program according to the embodiment of the present invention.

FIG. 5A shows the test program before being compressed; and FIG. 5B shows the test program after being compressed.

FIG. 7 shows a compression format of a conventional test program.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
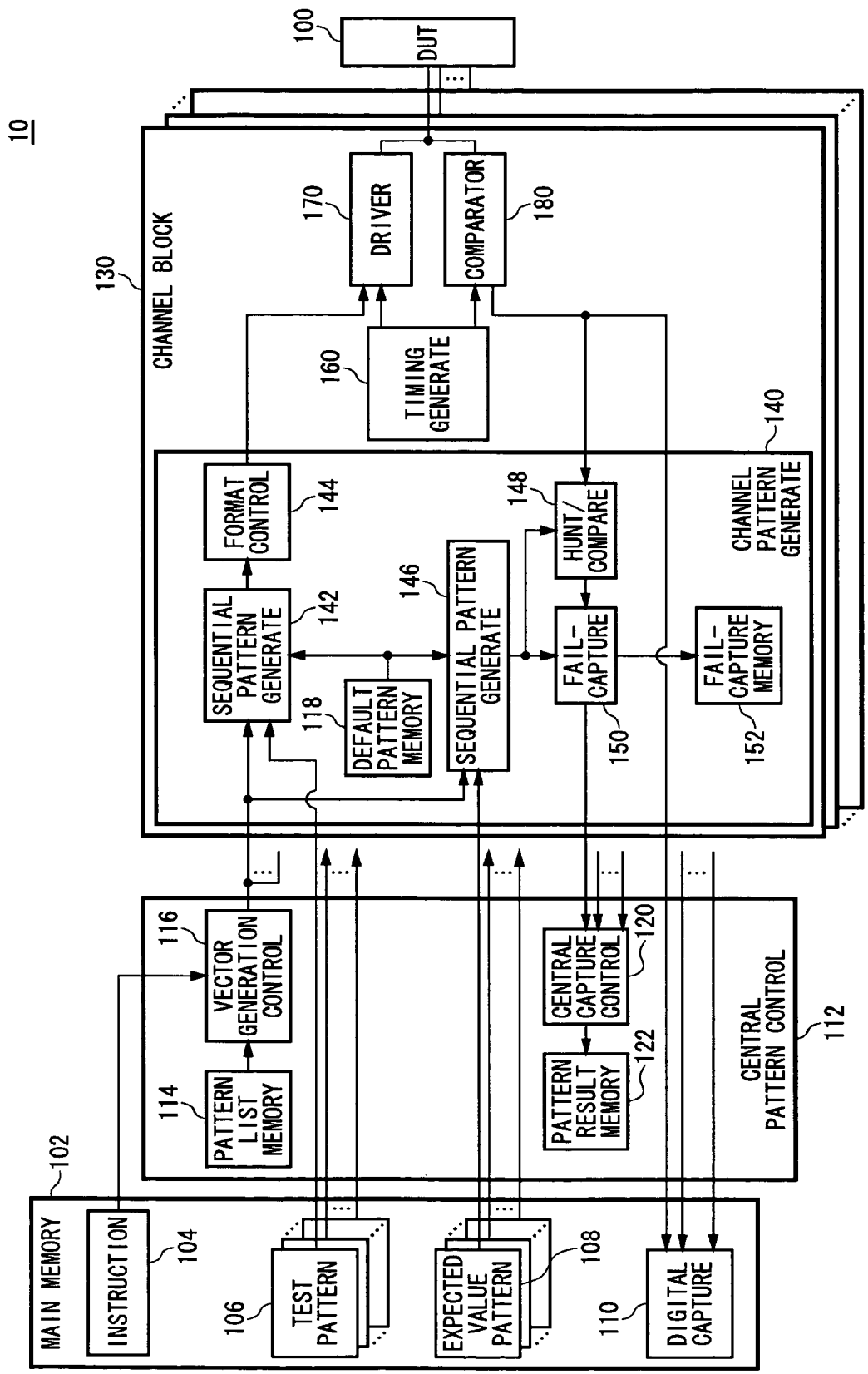
FIG. 1 illustrates a structure of a test apparatus 10 according to an embodiment of the present invention.

FIG. 1 illustrates a structure of a test apparatus 10 according to an embodiment of the present invention. The test apparatus 10 is a test apparatus that can test a DUT 100 having one or more terminals, and includes a main memory 120, a central pattern controller 112 and a plurality of channel blocks 130.

The main memory 102 stores a test program for the DUT 100 and stores an output pattern output from the DUT 100 as a result of execution of the test program. The main memory 102 includes an instruction memory 104, a plurality of test pattern memories 106, a plurality of expected value pattern memories 108 and a digital capture memory 110.

The instruction memory 104 stores each instruction included in the test program. The test pattern memories 106 are provided to correspond to the terminals of the DUT 100, respectively. Each test pattern memory 106 stores, for each instruction and for the corresponding terminal, test pattern sequence used in a period of an instruction cycle in which that instruction is executed. The test pattern sequence includes a plurality of test patterns that are to be sequentially output to the terminal of the DUT 100 during the instruction cycle. For example, in a case where the test apparatus 10 generates a 32-bit signal per one instruction cycle and outputs the 32-bit signal to the DUT 100, the test pattern memory 106 stores test pattern sequence formed by 32 test patterns that respectively correspond to 32 bits of the signal output in one instruction cycle, in such a manner that that test pattern sequence is associated with the corresponding instruction.

The expected pattern memories 108 are provided to correspond to the terminals of the DUT 100, respectively. Each expected pattern memory 108 stores, for each instruction and for the corresponding terminal, expected pattern sequence used in a period of an instruction cycle in which that instruction is executed. The expected value pattern sequence includes a plurality of expected value patterns that are to be sequentially compared with a plurality of output patterns sequentially output from the corresponding terminal of the DUT 100 in the instruction cycle. The digital capture memory 110 records the output pattern output from the DUT 100 as a result of execution of the test program.

In the above description, the instruction memory 104, a plurality of test pattern memories 106, a plurality of expected value pattern memories 108 and/or the digital capture memory 110 may be divided and provided in separate memory modules forming the main memory 102, or may be provided as different storage regions in the same memory module.

The central pattern controller 112 is connected to the main memory 102 and a plurality of channel blocks 130, and performs a process that is common to the respective terminals of the DUT 100. The central pattern controller 112 includes a pattern list memory 114, a vector generation controller 116, a central capture controller 120 and a pattern result memory 122.

The pattern list memory 114 stores for each of a main routine and sub-routine of the test program a start address and an end address of that routine, a start address of the test pattern in the test pattern memory 106, a start address of the expected value pattern of the expected value pattern memory 108, and the like. The vector generation controller 116 is an exemplary instruction execution unit of the present invention and sequentially executes instructions included in the test program for the DUT 100 for each instruction cycle. More specifically, the vector generation controller 116 reads out instructions from the start address to the end address from the pattern list memory 114 sequentially for each routine, and performs the read instructions sequentially.

The central capture controller 120 receives a result of determination for each terminal of the DUT 100 whether that terminal is non-defective or defective from the respective channel clocks 130 and gathers a result of determination for the DTU 100 whether or not that DUT 100 is non-defective or defective, for each routine. The pattern result memory 122 stores the determination result of the DUT 100 for each routine.

The channel clocks 130 are provided to correspond to the respective terminals of the DUT 100. Each channel block 130 includes a channel pattern generation unit 130, a timing generation unit 160, a driver 170 and a comparator 180.

The channel pattern generation unit 140 generates test pattern sequence or expected value pattern sequence that is used in a test of the corresponding terminal, and compares output pattern sequence with the expected value pattern sequence. The channel pattern generation unit 140 includes a default pattern memory 118, a sequential pattern generation unit 140, a format controller 144, a sequential pattern generation unit 146, a hung/compare unit 148, a fail-capture controller 150 and a fail-capture memory 152.

The default pattern memory 118 stores default pattern sequence of the test pattern sequence and/or the expected value pattern sequence (hereinafter, simply referred to as "pattern sequence"), that was set in advance, in such a manner that that default pattern sequence is associated with default pattern identification information for identifying that default pattern sequence. The test pattern memory 106 and/or the expected value pattern memory 108 does not store the pattern sequence that is the same as the default pattern sequence but stores default pattern sequence identification information of that default pattern sequence.

The sequential pattern generation unit 142 receives a start address of the test pattern sequence to be output in accordance with a routine to be executed, from the vector generation controller 116. Then, the sequential pattern generation unit 142 sequentially reads out the test pattern sequence from the thus received start address in the test pattern memory 106 so as to correspond to each instruction cycle, and sequentially outputs the read test pattern sequence to the format controller 144. The format controller 144 serves as a test pattern output unit of the present invention and converts the test pattern sequence into a format for controlling the driver 170.

The sequential pattern generation unit 146 receives a start address of the expected value pattern sequence from the vector generation controller 116 in accordance with a routine to be executed. Then, the sequential pattern generation unit 146 sequentially reads out the expected value pattern sequence from the thus received start address in the expected value pattern memory 108 so as to correspond to each instruction cycle, and sequentially outputs the expected value pattern sequence thus read to the hunt/compare unit 140 and the fail-capture controller 150. The hunt/compare unit 148 is an exemplary expected value comparator of the present invention, and inputs the output pattern sequence output from the DUT 100 via a comparator 180 and compares that output pattern sequence with the expected value pattern sequence. For output pattern sequence that is output from the DUT 100 at an indefinite timing, the hunt/compare unit 148 may have a hunting function that starts comparison with the expected value pattern, subject to output of a specific header pattern from the DUT 100.

The fail-capture controller 150 receives information indicating that the output pattern sequence of the DUT 100 and the expected value pattern sequence are coincident or inconsistent from the hunt/compare unit 148 and generates noon-defective/defective determination result of the DUT 100 for the corresponding terminal. The fail-capture memory 153 stores failure information including the result of the hunt process by the hunt/compare unit 148, a value of the output pattern that was not coincident with the expected value, and the like.

The timing generation unit 160 generates timings at which the driver 170 outputs respective test patterns in the test pattern sequence and a timing at which the comparator 180 takes the output pattern of the DUT 100 therein. The driver 170 serves as a test pattern output unit of the present invention, together with the format controller 144, and outputs respective test patterns output from the format controller 144 in the channel pattern generation unit 140 at the timings specified by the timing generation unit 160. The comparator 180 acquires the output pattern output from the terminal of the DUT 100 at the timing specified by the timing generation unit 160, and supplies the thus acquired output pattern to the hunt/compare unit 148 in the channel clock 130 and the digital capture memory 110.

Figure 2:
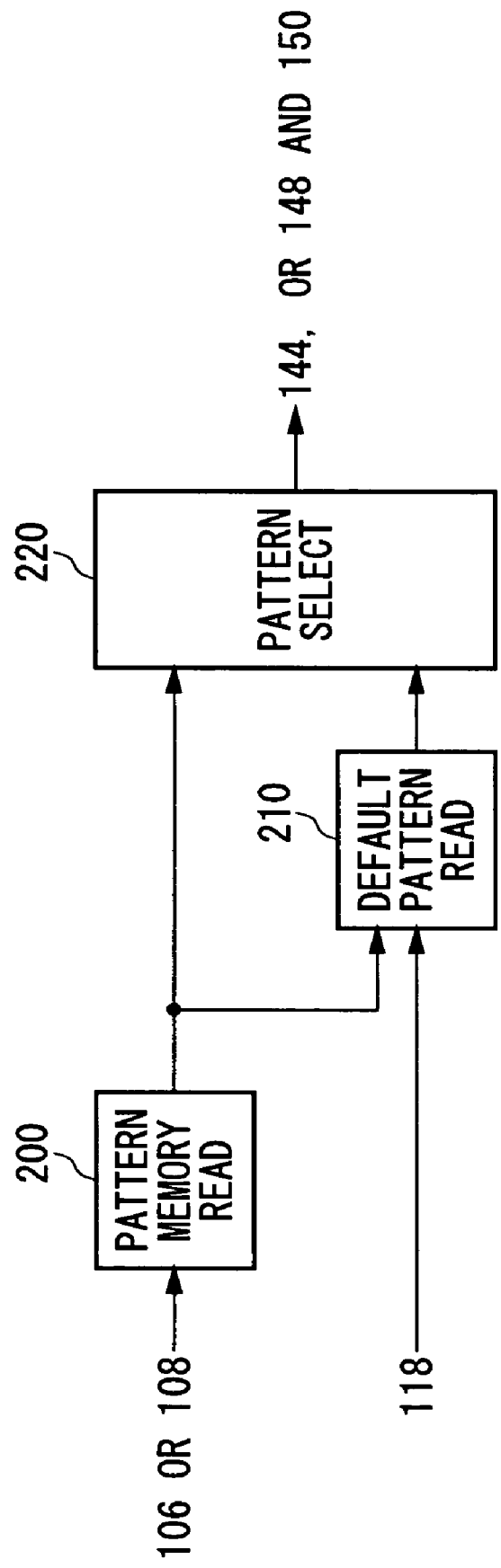
FIG. 2 illustrates a structure of a sequential pattern generation unit 142, 146 according to the embodiment of the present invention.

FIG. 2 illustrates the structure of the sequential pattern generation unit 142, 146 of the present embodiment.

The sequential pattern generation unit 142 includes a pattern memory read unit 200, a default pattern read unit 210 and a pattern select unit 220. The pattern memory read unit 200 is an exemplary pattern memory read unit of the present invention, and, in a case where the test apparatus 10 executes one instruction, reads out the test pattern sequence or the default pattern identification information that is stored in the test pattern memory 106 while being associated with that instruction. When the pattern memory read unit 200 read the default pattern identification information, the default pattern read unit 210 reads the default pattern sequence stored in the default pattern memory while being associated with that default pattern identification information. In this manner, the default pattern read unit 210 converts the default pattern identification information into the corresponding default pattern sequence.

The pattern select unit 220 selects, during a period of an instruction cycle in which that one instruction to be executed, the test pattern sequence read out from the test pattern memory 106 by the pattern memory read unit 200 or the default pattern sequence read out from the default pattern memory 118 by the default pattern read unit 210 in accordance with that one instruction, and outputs the selected pattern sequence to the format controller 144. More specifically, the pattern select unit 220 determines whether or not any of the test pattern sequence or default pattern identification information was read out from the test pattern memory 106 while being associated with hat one instruction, and, in a case where the test pattern sequence was read out, outputs that test pattern sequence output from the pattern memory read unit 200 to the format controller 144. On the other hand, in a case where the default pattern identification information was read out, the pattern select unit 220 outputs the default pattern sequence output from the default pattern read unit 210 to the format controller 144. When receiving the thus output pattern sequence, the format controller 144 and the driver 170, that form together an exemplary test pattern output unit of the present invention, output the test pattern sequence or default pattern sequence that was selected by the pattern select unit 220 to the terminal of the DUT 100 connected to the driver 170.

The sequential pattern generation unit 146 has a similar structure to the sequential pattern generation unit 142, and therefore the description thereof is omitted except for differences from the sequential pattern generation unit 142. The pattern memory read unit 200 of the sequential pattern generation unit 146 is an exemplary expected value pattern memory read unit of the present invention and, in a case where the test apparatus 10 executes one instruction, reads out an expected value pattern or default pattern identification information that is stored in the expected value pattern memory 108 and is associated with that one instruction. The default pattern read unit 210 operates in a similar manner to the default pattern read unit 210 of the sequential pattern generation unit 142. That is, in a case where the pattern memory read unit 200 read out the default pattern identification information, the default pattern read unit 210 converts that default pattern identification information into the corresponding default pattern sequence.

The pattern select unit 220 operates in a similar manner to the pattern select unit 220 of the sequential pattern generation unit 142. That is, during a period of an instruction cycle in which that one instruction is to be executed, the pattern select unit 220 of the sequential pattern generation unit 146 selects the expected value pattern sequence that was read out by the pattern memory read unit 200 from the expected value pattern memory 108 in accordance with that one instruction, or the default pattern sequence read out by the default pattern read unit 210 from the default pattern memory 118. The pattern select unit 220 outputs the thus selected pattern sequence to the format controller 144. When receiving the expected value pattern sequence or the default pattern sequence, the hunt/compare unit 148 as an exemplary expected value comparator of the present invention compares the expected value pattern sequence or default pattern sequence that was selected by the pattern select unit 220 with output pattern sequence formed by a plurality of output patterns output from the corresponding terminal of the DUT 100.

Instead of the structure in which the sequential pattern generation unit 142 and the sequential pattern generation unit 146 are separately provided, the channel pattern generation unit 140 may employ a structure in which a common sequential pattern generation unit having functions of both the sequential pattern generation unit 142 and the sequential pattern generation unit 146 is provided.

FIG. 3 shows an example of the pattern format information according to the present invention. In this embodiment, in order to enable determination whether or not either of pattern sequence or default pattern identification information is stored, the test pattern memory 106 and/or the expected-value pattern memory 108 store/stores test pattern format information and/or expected value pattern information (hereinafter, generally referred to as "pattern format information") so as to be associated with each instruction. An exemplary code format of the pattern format information is now described referring to FIG. 3.

The bit 0 of the pattern format information according to this embodiment is used as vector-length information that specifies a vector length of pattern sequence used in one instruction cycle. Please note that the test apparatus 10 of this embodiment includes a plurality of operating modes which have different vector-lengths of pattern sequence used in one instruction cycle. For example, the test apparatus 10 has the first operating mode (high-speed mode) in which a test is performed using test pattern sequence or expected value pattern sequence, that is formed by 32 patterns, and the second operating mode (low-speed mode) in which a test is performed using test pattern sequence and expected value pattern sequence, that is formed by a smaller number of patterns as compared to the pattern sequence used in the high-speed mode, for example, a single pattern. The vector-length information specifies whether or not the pattern sequence associated with the corresponding pattern format information is handled as the pattern sequence of the first operating mode or that of the second operating mode.

In the first operating mode (the bit 0 is "0"), the pattern format information identifies that pattern sequence is stored in a case where the pattern format information has a predetermined specific value (the bits 1–3 are "000"). In this case, the test pattern memory 106 and/or the expected value pattern memory 108 stores the pattern sequence of the first operating mode, i.e., the pattern sequence formed by 32 patterns, together with that pattern format information in such a manner that the pattern sequence and that pattern format information are associate with the instruction.

In the first operating mode, when the pattern format information does not have the specific value (the bits 1–3 are "001" to "111"), that pattern format information is used as default pattern identification information. In this case, the test pattern memory 106 and/or the expected value pattern memory 1008 stores that pattern format information so as to be associated with the instruction, but does not add the pattern sequence to that pattern format information.

In the first operating mode, the test apparatus 10 operates in the following manner. First, in a case where one instruction is executed, the pattern memory read unit 200 reads out pattern format information from the test pattern memory 106 or the expected value pattern memory 108 and, when the pattern format information has the specific value (the bits 0–3 are "0000"), further reads out pattern sequence. When the pattern format information does not have the specific value, the default pattern read unit 210 reads out default pattern sequence that is stored in the default pattern memory 118 to be associated with that pattern format information. Then, the pattern select unit 220 selects the pattern sequence output from the pattern memory read unit 200 when the pattern format information has the specific value, or selects the default pattern sequence output from the default pattern read unit 210 when the pattern format information does not have the specific value.

On the other hand, in the second operating mode (the bit 0 is "1"), the pattern format information identifies that pattern sequence is stored in a case of a predetermined specific value (the bits 1–3 are "000" and "111"). In the case where the bits 1–3 are "000", the test pattern memory 106 and/or the expected value pattern memory 108 stores the pattern sequence of the second operating mode, i.e., the pattern sequence formed by one pattern per instruction, together with that pattern format information. The pattern sequence of the second operating mode and the pattern format information are stored to be associated with 16 instructions to be executed during a period of successive 16 instruction cycles. In the case where the bits 1–3 are "111", the test pattern memory 106 and/or the expected value pattern memory 108 stores the pattern format information and the pattern sequence of the second operating mode having the length corresponding to the number of patterns specified by the bits 4–7. At this time, the pattern sequence and the pattern format information are stored to be associated with instructions, of which the number is equal to the number of the patterns, which are executed during a period of instruction cycles corresponding to the number of patterns specified by the bits 4–7. The test pattern memory 106 and/or the expected value pattern memory 108 can store a pattern having a variable length so as to be associated with one pattern format information by changing the bits 4–7.

In the second operating mode, the pattern format information is used as default pattern identification information in a case where the pattern format information has a value other than the specific value (i.e., the bits 1–3 are "001" to "110"). In this case, the test pattern memory 106 and/or the expected value pattern memory 108 stores that pattern format information so as to be associated with the instruction but does not add pattern sequence to the pattern format information.

In the second operating mode, the test apparatus 10 operates in the following manner. First, in a case where one instruction is executed, the pattern memory read unit 200 reads out pattern format information from the test pattern memory 106 or the expected value pattern memory 108, and, when the pattern format information has the specific value (the bits 0–3 are "1000" or "1111"), further reads out pattern sequence. When the pattern format information does not have the specific value, the default pattern read unit 210 reads out default pattern sequence that is stored in the default pattern memory 118 and is associated with that pattern format information. Then, the pattern select unit 220 selects the pattern sequence output from the pattern memory read unit 200 when the pattern format information has the specific value, or selects the default pattern sequence output from the default pattern read unit 210 when the pattern format information has a value other than the specific value. In the second operating mode, during a period of cycles of a plurality of instructions starting from that one instruction, patterns in the selected pattern sequence are sequentially used.

FIG. 4 shows an exemplary test program according to this embodiment. The test program shown in FIG. 4 includes a plurality of instructions to be executed sequentially, and test pattern sequence that are associated with each instruction and each terminal (CH1 to CH4) and are output to the DUT 100 during a period of an instruction cycle in which the associated instruction is executed. The instruction memory 104 stores the respective instructions shown in FIG. 4. Each of the test pattern memories 106 stores, for each instruction pattern, test pattern sequence that is output during a period of instruction cycle in which that instruction is executed, or pattern format information used a default pattern identification information for identifying default pattern sequence that is output during the period of instruction cycle in which that instruction is executed.

For example, so as to correspond to the first instruction "NOP", the test pattern memory 106 for the terminal CH1 stores test pattern sequence {011 . . . 110}; the test pattern memory 106 for the terminal CH2 stores a test pattern {000 . . . 110}; the test pattern memory 106 for the terminal CH3 stores a test pattern {011 . . . 000}; and the test pattern memory 106 for the terminal CH4 stores a test pattern {001 . . . 110}. More specifically, the test pattern memory 106 stores the corresponding test pattern sequence as a combination of pattern format information having a specific value (the bits 0–3 are "0000") and the pattern sequence added to that pattern format information.

Moreover, so as to correspond to the third instruction "IDXI 100", for example, the test pattern memories 106 for the terminal CH1 and CH2 store pattern format information CODEH1 (the bits 0–3 are "0001") that is other than the pattern format information having the specific value; the test pattern memory 106 for the terminal CH3 stores pattern format information CODEH2 (the bits 0–3 are "0010") that is other than the pattern format information having the specific value; and the test pattern memory 106 for the terminal CH4 stores pattern format information CODEH3 (the bits 0–3 are "0011") that is other than the pattern format information having the specific value. In this manner, a plurality of test pattern memories 106 can store default pattern identification information that is different between terminals so as to correspond to the same instruction.

In addition, so as to correspond to the ninth instruction "NOP", for example, the test pattern memory 106 for the terminal CH1 stores the pattern format information CODEH1 that does not have the specific value, while the test pattern memories 106 for the terminals CH2, CH3 and CH4 store the pattern format information having the specific value and test pattern sequence.

According to storing format of the test program described above, it is possible to determine, for the same instruction, whether test pattern sequence itself having the large data amount is stored or default pattern identification information with which the test pattern sequence is replaced is stored, for each terminal independently of other terminals. Thus, the data amount of the test program can be reduced more effectively.

More specifically, the first test pattern memory 106 corresponding to the first terminal of the DUT 100 may store one test pattern memory so as to be associated with one instruction, while the second test pattern memory 106 corresponding to the second terminal of the DUT 100 may store pattern format information including default pattern identification information so as to be associated with that instruction. In this case, the first pattern memory unit 200 corresponding to the first terminal of the DUT 100 reads out pattern format information having a specific value and one set of test pattern sequence that are stored to be associated to that instruction in the first test pattern memory 106. On the other hand, the second pattern memory read unit 200 corresponding to the second terminal of the DUT 100 reads out the pattern format information having a value other than the specific value, that is stored to be associated with that instruction in the second test pattern memory 106.

Next, the second default pattern read unit 210 corresponding to the second terminal reads out one set of default pattern sequence, that is stored to be associated with the pattern format information having the value other than the specific value in the default pattern memory 118. Then, the first channel pattern generation unit 140 and the driver 170 that correspond to the first terminal output the test pattern sequence read out from the first teat pattern memory 106 to the first terminal during one instruction cycle in which that one instruction is executed. On the other hand, the second format controller 144 and the driver 170 that correspond to the second terminal output the default pattern sequence read out by the second default pattern read unit 210 to the second terminal during the one instruction cycle.

According to the test apparatus 10 described above, it is possible to store test pattern sequence or pattern format information specifying default identification information in each test pattern memory 106 for the corresponding terminal independently of the other terminals, so as to correspond to the same instruction. Thus, a possibility of compressing a test program can be increased.

Although FIG. 4 shows a case in which the test pattern sequence is stored in the test pattern memory 106, a similar operation is performed for a case in which the expected value pattern sequence is stored in the expected value pattern memory 108. Therefore, the description of the latter case is omitted.

Figures 5A, 5B:
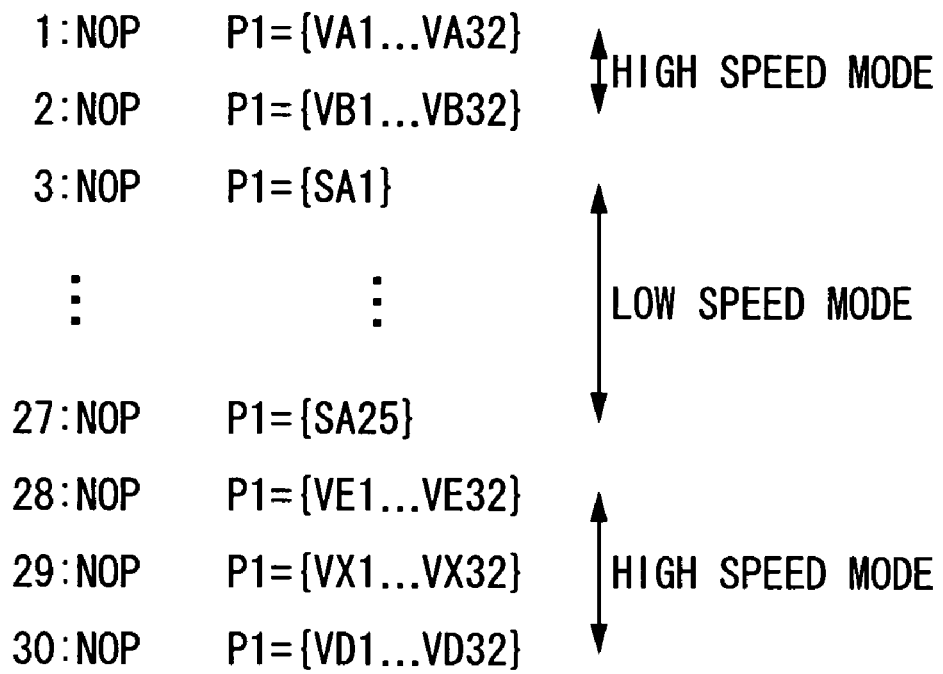
FIGS. 5A and 5B show a compression format of the test program according to the embodiment of the present invention.

FIGS. 5A and 5B show a compression format of the test program according to the present embodiment.

FIG. 5A shows the test program before being compressed. This test program makes the test apparatus 10 operate in the first operating mode (high-speed mode) in lines 1–2 and 28–30, thereby making the test apparatus 10 output test pattern sequence formed by 32 patterns per instruction cycle. Moreover, this test program makes the test apparatus 10 operate in the second operating mode (low-speed mode) in lines 3–27, thereby making the test apparatus 10 output one pattern per instruction cycle.

FIG. 5B shows the test program after being compressed. In this test program, test pattern sequence {VA1 . . . VA32} before being compressed is stored as default pattern sequence corresponding to default pattern identification information "H1" in the default pattern memory 118. Moreover, this test pattern sequence {VA1 . . . VA32} before being compressed is replaced with pattern format information CODEH1 that specifies the default pattern identification information "H1" and that pattern format information CODEH1 is stored in the test pattern memory 106. Similarly, test pattern sequence {VB1 . . . VB32}, {VD1 . . . VD32} and {VE1 . . . VE32} before being compressed are replaced with pattern format information CODEH2, CODEH4 and CODEH5 that specify default pattern identification information "H2", "H4" and "H5" and are then stored in the test pattern memory 106.

Test pattern sequence {SA1 . . . SA16} including test patterns that are sequentially output so as to correspond to successive 16 instructions in the second operating mode is stored as default pattern sequence of the second operating mode that corresponds to default pattern identification information "L1" in the default pattern memory 118.

Test pattern sequence {VX1 . . . VX32} before being compressed is stored in the test pattern memory 106 as a set of pattern format information CODEH0 having a specific value (the bits 1–4 are "0000") and that test pattern. Similarly, test pattern sequence {SA17 . . . SA25} before being compressed is stored in the test pattern memory 106 as a set of pattern format information CODEL7 having a specific value (the bits 1–4 are "1111" and the bits 5–8 are "9") and the test pattern sequence {SA17 . . . SA25} including 9 patterns.

According to the compression method of the test program described above, the test apparatus 10 stores test pattern sequence that frequently appears as default pattern sequence in the default pattern memory 118. Thus, the test apparatus 10 can replace each of a number of sets of test pattern sequence contained in the test program with pattern format information that specifies the default pattern sequence corresponding to that test pattern sequence, thereby the size of the test program can be efficiently reduced.

Although FIGS. 5A and 5B show a case in which the test pattern sequence is stored in the test pattern memory 106, a similar operation is performed for a case in which the expected value pattern is stored in the expected value pattern memory 108. Thus, the description of the latter case is omitted.

Figure 6:
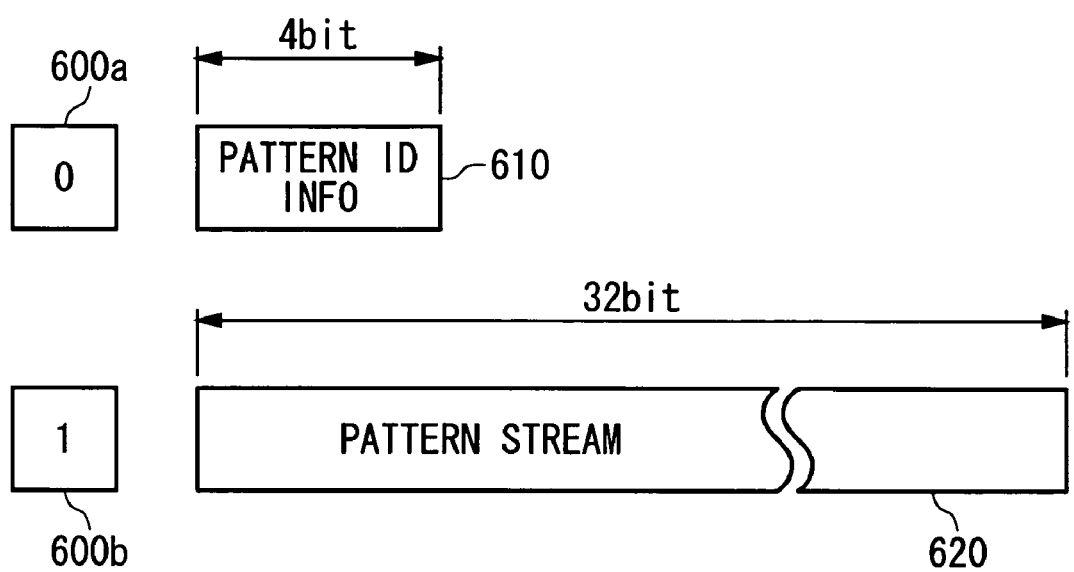
FIG. 6 shows an example of pattern format information according to a modification of the embodiment of the present invention.

FIG. 6 shows an example of pattern format information according to a modification of the embodiment of the present invention.

The test pattern memory 106 and/or the expected value patter memory 108 of this modified example store pattern format information 600 that identifies whether default pattern identification information or pattern sequence is stored so as to be associated with each instruction, and test pattern data including either of pattern identification information 610 and pattern sequence 620. For example, the pattern format information 600 is one bit, and identifies that the pattern identification information 610 is stored to be associated with that instruction in a case where the pattern format information 600 is "0". In this case, the test pattern memory 106 and/or the expected value pattern memory 108 stores a set of that pattern format information 600a and test pattern data including the pattern identification information 610. On the other hand, in a case where the pattern format information 600 is "1", it is identified that the pattern sequence 620 is stored to be associated with that instruction. In this case, the test pattern memory 106 and/or the expected value pattern memory 108 stores a set of that pattern format information 600b and test pattern data including the pattern sequence 620.

The test apparatus 10 using the pattern format information according to this modified example has similar functions and structure to the test apparatus 10 shown in FIGS. 1–5B, except for the following. In a case where one instruction is executed, the pattern memory read unit 200 according to this modified example reads the test pattern format information and the test pattern data that are stored to be associated with that instruction in the test pattern memory 106. Then, in a case where the test pattern format information indicated that the default pattern identification information was stored, the default patter read unit 210 reads the default pattern sequence that is stored in the default pattern memory 118 to be associated with that default pattern identification information included in the test pattern data. Subsequently, the test apparatus 10 outputs the test pattern sequence or default pattern sequence in a similar manner to the test apparatus 10 shown in FIGS. 1–5B.

The pattern format information according to this modified example does not include information for specifying one of the first operating mode and the second operating mode. However, the number of bits of the pattern format information 600 may be increased so that the pattern format information 600 includes the above information, or the above information may be included in the pattern identification information 610 or the pattern sequence 620.

Although FIG. 6 shows a case in which the test pattern sequence is stored in the test pattern memory 106, a similar operation is performed for a case in which the expected value pattern sequence is stored in the expected value pattern memory 108. Therefore, the description of the latter case is omitted.

As described above, according to the test apparatus 10 of the present embodiment, pattern sequence stored for the same instruction in a plurality of test pattern memories 106 and/or a plurality of expected value pattern memories 108 can be compressed for each terminal of the DUT 100 independently of the other terminals. Thus, compression efficiency of a test program can be improved. Moreover, since the test program can be efficiently compressed, an average amount of data read out from the test pattern memory 106 and/or the expected value pattern memory 108 per instruction can be reduced. Thus, required throughput of the main memory 102 can be suppressed to be relatively low.

Although the present invention has been described by way of exemplary embodiments, it should be understood that those skilled in the art might make many changes and substitutions without departing from the spirit and the scope of the present invention which is defined only by the appended claims.

What is claimed is:

1. A test apparatus for testing a device under test, comprising:

an instruction execution unit for sequentially executing instructions included in a test program for said device under test in each instruction cycle;

a default pattern memory for storing one or more default pattern sequences to be associated with one or more pieces of default pattern identification information for identifying said default pattern sequences, respectively, said default pattern sequences being preset ones of a plurality of test pattern sequences, each of which is formed by a plurality of test patterns to be sequentially output to a terminal of said device under test during an instruction cycle period;

a test pattern memory for storing, for each of said instructions, test pattern sequences that are output in instruction cycle periods in which said instructions are executed or said default pattern identification information for identifying said default pattern sequences that are output in said instruction cycle periods;

a test pattern memory read unit for reading, when one of said instructions is executed, said test pattern sequences or said default pattern identification information that are stored to be associated with one of said instructions in said test pattern memory;

a default pattern read unit for reading, if said test pattern memory read unit read said default pattern identification information, said default pattern sequences that are stored to be associated with said default pattern identification information in said default pattern memory; and a test pattern output unit for outputting said test pattern sequence read out by said test pattern memory read unit, corresponding to one of said instructions, or said default pattern sequence read out by said default pattern read unit to a terminal of said device under test during an instruction cycle period for executing one of said instructions.

2. A test apparatus as claimed in claim 1,
wherein said device under test includes a plurality of terminals, and
said test apparatus includes said test pattern memory, said test pattern memory read unit, said default pattern read unit and said test pattern output unit corresponding to each of said plurality of terminals.

3. A test apparatus as claimed in claim 2, wherein said test pattern memory comprises a first test pattern memory and a second test pattern memory, said test pattern memory read unit comprises a first test pattern memory read unit and a second test pattern memory read unit, said default pattern read unit comprises a first default pattern read unit corresponding to a first terminal of said device under test and a second default pattern read unit, said test pattern output unit comprises a first test pattern output unit and a second test pattern output unit,
where when a first test pattern memory corresponding to said first terminal stores one of said test pattern sequences to be associated with one of said instructions and a second test pattern memory corresponding to a second terminal of said device under test stores one piece of said default pattern identification information to be associated with one of said instructions,
said first test pattern memory read unit corresponding to said first terminal reads out said one test pattern sequence that is stored in said first test pattern memory to be associated with one of said instructions,
said second test pattern memory read unit corresponding to said second terminal reads out said one piece of default pattern identification information that is stored in said second test pattern memory to be associated with one of said instructions,
said second default pattern read unit corresponding to said second terminal reads out said one of said default pattern sequences that is stored to be associated with said one piece of default pattern identification information in said default pattern memory,
said first test pattern output unit corresponding to said first terminal outputs said one of said test pattern sequences to said first terminal during said instruction cycle period for executing said one of said instructions and
said second test pattern output unit corresponding to said second terminal outputs said one default pattern sequence to said second terminal during said instruction cycle period for executing one of said instructions.

4. A test apparatus as claimed in claim 1,
wherein said test pattern memory stores test pattern format information for identifying which one of said test pattern sequence and said default pattern identification information is stored and test pattern data including either of said test pattern sequences and said default pattern identification information, to be associated with each instruction,
said test pattern memory read unit reads out said test pattern format information and said test pattern data that are stored to be associated with said one instruction in said test pattern memory, and
when said test pattern format information indicates that said default pattern identification information was stored, said default pattern read unit reads out said default pattern sequence that is stored in said default pattern memory to be associated with said default pattern identification information included in said test pattern data.

5. A test apparatus as claimed in claim 1,
wherein said test pattern memory stores test pattern format information for each of said instructions, said test pattern format information indicating that said test pattern sequence is stored when having a predetermined specific value and being used as said default pattern identification information when having a value other than said specific value, said test pattern memory further storing one of said test pattern sequences when said test pattern format information has said specific value,
when said one of said instructions is executed, said test pattern memory read unit reads out said test pattern format information and also reads out one of said test pattern sequences when said test pattern format information has said specific value, and when said test pattern format information has said value other than said specific value, said default pattern read unit reads out said default pattern sequence that is stored to be associated with said test pattern format information in said default pattern memory.

6. A test apparatus for testing a device under test, comprising:
an instruction execution unit for sequentially executing instructions included in a test program for said device under test in each instruction cycle;
a default pattern memory for storing default pattern sequence to be associated with default pattern identification information for identifying said default pattern sequence, said default pattern sequence being a preset one of a plurality of expected value pattern sequence sets, each of which is formed by a plurality of expected value patterns that are to be sequentially compared with a plurality of output patterns sequentially output from a terminal of said device under test during an instruction cycle period;
an expected value pattern memory for storing, for each of said instructions, expected value pattern sequence that is to be compared with said plurality of output patterns in an instruction cycle period for executing said instruction, or said default pattern identification information for identifying said default pattern sequence that is to be compared with said plurality of output patterns in said instruction cycle period;
an expected value pattern memory read unit for reading, when one instruction is executed, said expected value pattern sequence or said default pattern identification information that is stored to be associated with said one instruction in said expected value pattern memory;
a default pattern read unit for reading, when said expected value pattern memory read unit read said default pattern identification information, said default pattern sequence that is stored to be associated with said default pattern identification information in said default pattern memory; and
an expected value compare unit for comparing said expected value pattern sequence read out by said expected value pattern memory to correspond to said one instruction, or said default pattern sequence read out by said default pattern read unit with output pattern sequence formed by a plurality of output patterns output from a terminal of said device under test during an instruction cycle period for executing said one instruction.

7. A test method for testing a device under test with a test apparatus, comprising:

an instruction execution step for sequentially executing instructions included in a test program for said device under test in each instruction cycle;

a default pattern memory step for storing default pattern sequence to be associated with default pattern identification information for identifying said default pattern sequence, said default pattern sequence being a preset one of a plurality of test pattern sequence sets, each of which is formed by a plurality of test patterns to be sequentially output to a terminal of said device under test during an instruction cycle period;

a test pattern memory step for storing, for each of said instructions, test pattern sequence that is output in an instruction cycle period for executing said instruction, or said default pattern identification information for identifying said default pattern sequence that is output in said instruction cycle period;

a test pattern memory read step for reading, when one instruction is executed, said test pattern sequence or said default pattern identification information that is stored to be associated with said one instruction in said test pattern memory;

a default pattern read step for reading, when said default pattern identification information was read in said test pattern memory read step, said default pattern sequence that is stored to be associated with said default pattern identification information in said default pattern memory step; and a test pattern output step for outputting said test pattern sequence read out in said test pattern memory read step to correspond to said one instruction, or said default pattern sequence read out in said default pattern read step to a terminal of said device under test during an instruction cycle period for executing said one instruction.

8. A test method for testing a device under test with a test apparatus, comprising:

an instruction execution step for sequentially executing instructions included in a test program for said device under test in each instruction cycle;

a default pattern memory step for storing default pattern sequence to be associated with default pattern identification information for identifying said default pattern sequence, said default pattern sequence being a preset one of a plurality of expected value pattern sequence sets, each of which is formed by a plurality of expected value patterns to be sequentially compared with a plurality of output patterns to be sequentially output from a terminal of said device under test during an instruction cycle period;

an expected value pattern memory step for storing, for each of said instructions, expected value pattern sequence that is to be compared with said plurality of output patterns in an instruction cycle period for executing said instruction, or said default pattern identification information for identifying said default pattern sequence that is compared with said plurality of output patterns in said instruction cycle period;

an expected value pattern memory read step for reading out, when one instruction is executed, said expected value pattern sequence or said default pattern identification information that is stored to be associated with said one instruction in said test pattern memory step;

a default pattern read step for reading, when said default pattern identification information was read in said expected value pattern memory read step, said default pattern sequence that is stored to be associated with said default pattern identification information in said default pattern memory step; and an expected value compare step for comparing said expected value pattern sequence that was read in said expected value pattern memory read step to correspond to said one instruction or said default pattern steam that was read in said default pattern memory read step with output pattern sequence formed by a plurality of said output patterns output from said terminal of said device under test.

* * * * *

UNITED STATES PATENT AND TRADEMARK OFFICE
CERTIFICATE OF CORRECTION

PATENT NO. : 7,213,182 B2
APPLICATION NO. : 11/039394
DATED : May 1, 2007
INVENTOR(S) : Shinichi Kobayashi It is certified that error appears in the above-identified patent and that said Letters Patent is hereby corrected as shown below:

In the Claims:

In Claim 3, column 15, line 25, the word "where" should be deleted.

Signed and Sealed this

Sixteenth Day of October, 2007

JON W. DUDAS
*Director of the United States Patent and Trademark Office*